United States Patent
Pessi

(10) Patent No.: US 7,657,656 B2
(45) Date of Patent: Feb. 2, 2010

(54) SIGNAL MESSAGE DECOMPRESSOR

(75) Inventor: Pekka Pessi, Helsinki (FI)

(73) Assignee: Nokia Corporation, Espoo (FI)

( * ) Notice: Subject to any disclaimer, the term of this patent is extended or adjusted under 35 U.S.C. 154(b) by 521 days.

(21) Appl. No.: 11/505,327

(22) Filed: Aug. 17, 2006

(65) Prior Publication Data

US 2007/0140125 A1 Jun. 21, 2007

(30) Foreign Application Priority Data

Dec. 20, 2005 (GB) .................. 0525902.3

(51) Int. Cl.
G06F 15/16 (2006.01)
H04L 12/28 (2006.01)
G06F 9/45 (2006.01)

(52) U.S. Cl. .................. 709/247; 370/389; 717/148

(58) Field of Classification Search .................. None
See application file for complete search history.

(56) References Cited

U.S. PATENT DOCUMENTS

| 5,970,177 | A * | 10/1999 | Chinnock | 382/244 |
|---|---|---|---|---|
| 2005/0076172 | A1 * | 4/2005 | Caska | 711/1 |
| 2005/0104753 | A1 * | 5/2005 | Dror et al. | 341/51 |
| 2005/0172032 | A1 * | 8/2005 | Pessi | 709/246 |
| 2006/0158354 | A1 * | 7/2006 | Aberg et al. | 341/50 |

FOREIGN PATENT DOCUMENTS

EP 1 653 698 5/2006

OTHER PUBLICATIONS

International Search Report, PCT/IB2006/003680, Filed Dec. 12, 2006.
A. Surtees, M. West, Siemens/Roke Manor Research, Oct. 24, 2005, SigComp Users' Guide draft-ietf-rohc-sigcomp-user-guide-04.txt, Robust Header Compression, Internet Draft, Expires: Apr. 27, 2006, pp. 1-42.
M. Nordberg, et al.: Improving sigcomp performance through extended operations, Oct. 2003, pp. 3425-3428.
H. Hannu, et al.., Network Working Group, Request for Comments: 3321, Category: Informational, Signaling Compression (SigComp)-Extended Operations, Jan. 2003, pp. 1-18.
A, Surtees, M. West, Seimens/Roke Manor, A. Roach, Estacado Systems, Jul. 15, 2005, Robust Header Compression, Internet-Draft, Expires: Jan. 16, 2006, Implementer's Guide for SigComp, draft-ietf-rohc-sigcomp-impl-guide-05.txt.

* cited by examiner

*Primary Examiner*—Wen-Tai Lin
(74) *Attorney, Agent, or Firm*—Mintz, Levin, Cohn, Ferris, Glovsky, and Popeo, P.C.

(57) ABSTRACT

A method for decompressing a signalling message in a communications device in a communication system comprising the steps of receiving a virtual machine bytecode block for carrying out decompression on the signalling message; detecting in at least one part of the virtual machine bytecode block at least one predefined code block, matching the virtual machine bytecode block comprising at least one detected code blocks against a bytecode reference block comprising a reference to at least one instruction set; selecting the at least one instruction set on the basis on the matching step; and performing the selected at least one instruction set.

13 Claims, 4 Drawing Sheets

DEFLATE SIGNATURE CONSISTS OF THREE BASIC BLOCKS, CONNECTED BY THE POSSIBLE EXECUTION FLOW.

SIGNAL MESSAGE DECOMPRESSOR

FIELD OF THE INVENTION

The present invention relates to communication systems, and in particular, to signal message decompressors within communication sessions handling messages for example SIP messages.

DESCRIPTION OF THE RELATED ART

A communication system can be seen as a facility that enables communication sessions between two or more entities such as user equipment and/or other nodes associated with the communication system. The communication may comprise, for example, communication of voice, data, multimedia and so on. A user equipment may, for example, be provided with a two-way telephone call or multi-way conference call. A user equipment may also be provided with a connection to an application providing entity, for example to an application server (AS), thus enabling use of services provided by the application server.

A communication system typically operates in accordance with a given standard or specification which sets out what the various entities associated with the communication system are permitted to do and how that should be achieved. For example, the standard or specification may define if the user, or more precisely, user equipment is provided with a circuit switched service and/or a packet switched service. Communication protocols and/or parameters which shall be used for the connection may also be defined. In other words, a specific set of "rules" on which the communication can be based on needs to be defined to enable communication by means of the system.

Communication systems providing wireless communication for user equipment are known. An example of the wireless systems is the public land mobile network (PLMN). Another example is a mobile communication system that is based, at least partially, on use of communication satellites. Wireless communications may also be provided by means of other arrangements, such as by means of wireless local area networks (WLAN). Communication on the wireless interface between the user equipment and the elements of the communication network can be based on an appropriate communication protocol. The operation of the station apparatus of the communication system and other apparatus required for the communication can be controlled by one or several control entities. The various control entities may be interconnected. One or more gateway nodes may also be provided for connecting a communication network to other networks. For example, a mobile network may be connected to communication networks such as an IP (Internet Protocol) and/or other packet switched data networks.

An example of the services that may be offered for users of a communication system is the so called multimedia services. An example of the communication systems enabled to offer multimedia services is the Internet Protocol (IP) Multimedia network. IP Multimedia (IM) functionalities can be provided by means of a IP Multimedia Core Network (CN) subsystem, or briefly IP Multimedia subsystem (IMS). The IMS includes various network entities for the provision of the multimedia services.

The Third Generation Partnership Project (3GPP) has defined use of the General Packet Radio Service (GPRS) as a backbone communication system for the provision of the IMS services, the GPRS being given herein as a non-limiting example of a possible backbone communication system enabling the multimedia services. The Third Generation Partnership Project (3GPP) has also defined a reference architecture for the third generation (3G) core network which will provide the users of user equipment with access to the multimedia services. This core network is divided into three principal domains. These are the Circuit Switched (CS) domain, the Packet Switched (PS) domain and the Internet Protocol Multimedia (IM) domain.

The latter of these, the IM domain, is for ensuring that multimedia services are adequately managed. The 3G IM domain supports the Session Initiation Protocol (SIP) as developed by the Internet Engineering Task Force (IETF). Session Initiation Protocol (SIP) is an application-layer control protocol for creating, modifying and terminating sessions with one or more participants (endpoints).

Before a user equipment is able to communicate with an IM CN subsystem, a GPRS attach procedure must be performed and a communication channel known as Packet Data Protocol (PDP) context for SIP signalling must be established.

With low-rate IP connectivity, transmission delays are significant. Call setup and feature invocation are adversely affected by retransmissions and multiple messaging, as required in some flows. SigComp protocols provide a solution to this problem by offering robust, loss-less compression of application messages. Due to the heavy signaling involved and SIP, being a text based protocol, 3GPP IMS Release 5 standards mandates SigComp (Signaling Compression).

Once a device is in receipt of a SigComp compressed message or a message to compress an uncompressed message using the SigComp protocols, the device initialized an instance of a virtual machine (UDVM) for compressing/decompressing the message.

The virtual machine is quite limited in its capabilities. For example the memory usable by the virtual machine is limited to the receive buffer used by the decompressing/compressing endpoint. The total amount of memory allocated for receive buffer and virtual machine is typically only a few kilobytes. This is because for SIP endpoints the default decompression memory size (dms) is 8 kilobytes, therefore in the virtual machine for compression and decompression both instructions and data must fit within this limited space. The virtual machine program is allowed simple I/O operations: it can input data from the compressed message, it can output decompressed data, and it can create, access and free state items. State items are items stored within the virtual machine memory from previously received messages.

The memory used by a UDVM is typically 4 kilobytes or less. Part of it is consumed by bytecode and its variables. Typically, there is only 3.5 kilobytes or less available for the ring buffer and other data structures storing the received compressed message, the processed decompressed message and any further dictionaries. When compressing longer messages, it is not possible to keep known static (3468 or 4836 bytes depending on algorithm) and dynamic dictionaries as well as complete compressed message completely in the memory.

The UDVM is active only when the protocol message is received. After receiving a SigComp message, the endpoint invokes the UDVM. For example in decompression the UDVM executes the bytecode or instructions to perform the decompression steps until the message has been completely decompressed or an error occurs.

Bytecode is computer object code that is processed by the virtual machine, rather than by the "real" device, the hardware processor. The virtual machine converts each generalized machine instruction into a specific machine instruction or instructions that the device's processor will understand. These specific machine instructions are also known as native code.

The decompression algorithm is transmitted along with the compressed message to the recipient. The recipient executes the decompression algorithm using the virtual machine.

Executing UDVM bytecode using a UDVM interpreter is wasteful in terms of CPU resources. For example without any run-time optimizations a device requires between 50 and 100 times more CPU power to perform the same task in the same time when using bytecode on a UDVM interpreter as compared with device specific compiled code (native code).

Attempts to optimise the virtual machine code are well-known. One approach is to recognise the bytecode block by matching the block against a list of stored blocks. As the UDVM programmer has access to well-defined bytecodes blocks, it is possible to detect that an uploaded bytecode block matches a predefined bytecode template and invoke native code linked to the template. One such approach is seen in Surtees et al, "Implementer's Guide for SigComp", Internet draft draft-ieff-rohc-sigcomp-impl-guide-04.txt, published by the Internet Engineering Task Force in February 2005. In this document an example is shown where no compression is performed to show that the bytecode (13-byte NULL bytecode), can be recognised and optimized by a replacement algorithm.

Unfortunately these techniques do not apply well to Sig-Comp bytecode blocks in general. As typical decompression algorithms chosen are usually augmented with other auxiliary code, performing application-specific auxiliary functions like managing application-specific dictionaries and shared states, there are many different bytecode implementations of the same algorithms. For example these differences may be as subtle as decompressing without dictionaries, using static dictionaries, or dynamic dictionaries, or differences in updating dictionaries.

Due to this the UDVM would have to store a long list of potential interpretations in order to recognize the received bytecode block variant. In a limited memory space as found in the UDVM any search and replacement algorithm would be only capable of recognizing and therefore optimizing a small portion of the possible interpretations or where space was not as limited require a significant memory penalty and processing penalty as the algorithm performs an search through the stored variants in order to produce a valuable replacement improvement.

SUMMARY OF THE INVENTION

Embodiments of the present invention aim to at least partially address the above problem.

There is provided according to the present invention a method for decompressing a signalling message in a communications device in a communication system comprising the steps of: receiving a virtual machine bytecode block for carrying out decompression on the signalling message; detecting in at least one part of the virtual machine bytecode block at least one predefined code block, matching the virtual machine bytecode block comprising at least one detected code blocks against a bytecode reference block comprising a reference to at least one instruction set; selecting the at least one instruction set on the basis on the matching step; and performing the selected at least one instruction set.

The step of detecting may comprise the steps of: detecting the at least one part of the virtual machine bytecode for references to memory locations used to at least one of read and write data, and matching the memory location references to predefined code block memory locations.

The virtual machine bytecode may be received by a universal decompression virtual machine.

The instruction set may comprise native machine code.

The method may further comprise the steps of: detecting in a further part of the virtual machine bytecode a further predefined code block; detecting the order of performing the first and further bytecode parts and further selecting the instruction set based on the step of detecting the order of performing the first and further bytecode parts.

The step of detecting the order of performing the steps may comprise the steps of: comparing the order of performing combinations of the first and further bytecode parts and assigning a performance metric to each combination; and wherein the step of further selecting the instruction set is based on the value of the performance metric.

According to a second aspect of the present invention there is provided a communications device for decompressing a signalling message in a communication system, comprising: a receiver arranged to receive a virtual machine bytecode block; a detector arranged to detect in at least one part of the received virtual machine bytecode block at least one predefined code block; a matcher arranged receive the output of the detector and further arranged to match the at least one part of the received virtual machine bytecode block comprising the at least one detected code block with a bytecode reference comprising the at least one detected code block; the bytecode reference comprising a reference to an instruction set; a selector arranged to receive the bytecode reference and select the instruction set on the basis of the received bytecode reference; and a processor arranged to receive the instruction set and process the selected instruction set.

The detector may further comprise a memory detector arranged to examine the at least one part of the virtual machine bytecode for references to memory locations used to read and write data, and to detect whether the memory location references are the same as the predefined code block memory locations.

The receiver may be a universal decompression virtual machine bytecode receiver.

The instruction set may comprise native machine code.

The detector may be arranged to detect within at least one further part of the virtual machine bytecode a further predefined code block.

The communications device may further comprise a code order detector arranged to detect the order of performing the first and further bytecode parts.

The communications device may further comprise a code order optimizer arranged to further select the instruction set on the basis of the output of the code order detector.

The communications device is preferably user equipment.

The bytecode block may comprise at least part of a compressed SIP message.

According to a third aspect of the present invention there is provided a computer program product arranged to decompress a signalling message in a communications device operating in a communication system comprising the steps of: receiving a virtual machine bytecode block for carrying out decompression on the signalling message; detecting in at least one part of the virtual machine bytecode block at least one predefined code block, matching the virtual machine bytecode block comprising at least one detected code blocks against a bytecode reference block comprising a reference to at least one instruction set; selecting the at least one instruction set on the basis on the matching step; and performing the selected at least one instruction set.

BRIEF DESCRIPTION OF THE DRAWINGS

For better understanding of the present invention, reference will now be made by way of example to the accompanying drawings in which.

DETAILED DESCRIPTION OF THE PREFERRED EMBODIMENTS

Certain embodiments of the present invention will be described in the following by way of example, with reference to the exemplifying architecture of a third generation (3G) mobile communications system. However, it shall be appreciated that the embodiments may be applied to any suitable communication system. Furthermore although the examples as described below refer to a compression operation and specifically to a DEFLATE algorithm variant of a SigComp compression algorithm, it shall be appreciated that the embodiments may be applied to any suitable SigComp algorithm not specifically limited to performing a compression.

Figure 1:
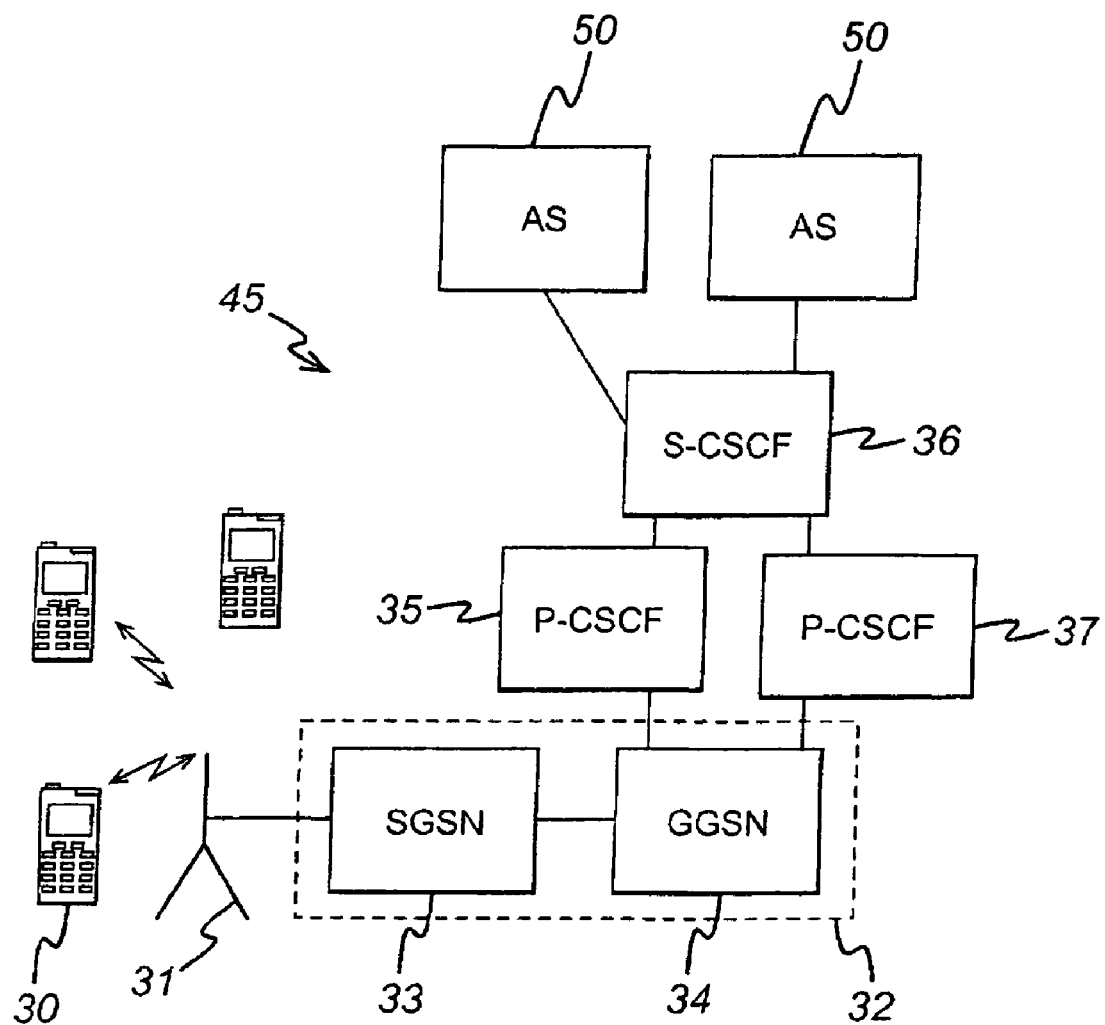
FIG. 1 shows a schematic view of a communication system environment wherein the invention can be embodied.

Reference is made to FIG. 1 which shows an example of a network architecture wherein the invention may be embodied. In FIG. 1 an IP Multimedia Network 45 is provided for offering IP multimedia services for IP Multimedia Network subscribers.

As described above, access to IP Multimedia (IM) services can be provided by means of a mobile communication system. A mobile communication system is typically arranged to serve a plurality of mobile user equipment usually via a wireless interface between the user equipment and at least one base station 31 of the communication system. The mobile communication system may logically be divided between a radio access network (RAN) and a core network (CN).

The base station 31 is arranged to transmit signals to and receive signals from a mobile user equipment 30 via a wireless interface between the user equipment and the radio access network. Correspondingly, the mobile user equipment 30 is able to transmit signals to and receive signals from the radio access network via the wireless interface.

In the shown arrangement the user equipment 30 may access the IMS network 45 via the access network associated with the base station 31. It shall be appreciated that, although, for clarity reasons FIG. 1 shows a base station of only one radio access network, a typical communication network system usually includes a number of radio access networks.

The 3G radio access network (RAN) is typically controlled by appropriate radio network controller (RNC). This controller is not shown in order to enhance clarity. A controller may be assigned for each base station or a controller can control a plurality of base stations, for example in the radio access network level. It shall be appreciated that the name, location and number of the radio network controllers depends on the system.

The mobile user equipment 30 of FIG. 1 may comprise any appropriate mobile user equipment adapted for Internet Protocol (IP) communication to connect the network. For example, the mobile user may access the cellular network by means of a Personal computer (PC), Personal Data Assistant (PDA), mobile station (MS) and so on. The following examples are described with reference to mobile stations.

One skilled in the art is familiar with the features and operation of a typical mobile station. Thus, it is sufficient to note that the user may use a mobile station for tasks such as for making and receiving phone calls, for receiving and sending data from and to the network and for experiencing multimedia content or otherwise using multimedia services. A mobile station may include an antenna for wirelessly receiving and transmitting signals from and to base stations of the mobile communication network. A mobile station may also be provided with a display for displaying images and other graphical information for the user of the mobile user equipment. Camera means may be provided for capturing still or video images. Speaker means are also typically provided. The operation of a mobile station may be controlled by means of an appropriate user interface such as control buttons, voice commands and so on. Furthermore, a mobile station is provided with a processor entity and a memory means.

It shall be appreciated that although only few mobile stations are shown in FIG. 1 for clarity, a great number of mobile stations may be in simultaneous communication with a communication system.

A core network (CN) typically includes various switching and other control entities and gateways for enabling the communication via a number of radio access networks and also for interfacing a single communication system with one or more communication systems such as with other cellular systems and/or fixed line communication systems. In the 3GPP systems the radio access network is typically connected to an appropriate core network entity or entities such as, but not limited to, a serving general packet radio service support node (SGSN) 33. The radio access network is in communication with the serving GPRS support node via an appropriate interface, for example on an Iu interface. The serving GPRS support node, in turn, typically communicates with an appropriate gateway, for example a gateway GPRS support node 34 via the GPRS backbone network 32. This interface is commonly a switched packet data interface.

In a 3GPP network, a packet data session is established to carry traffic flows over the network. Such a packet data session is often referred as a packet data protocol (PDP) context. A PDP context may include a radio bearer provided between the user equipment and the radio network controller, a radio access bearer provided between the user equipment, the radio network controller and the SGSN 33, and switched packet data channels provided between the serving GPRS service node 33 and the gateway GPRS service node 34. Each PDP context usually provides a communication pathway between a particular user equipment and the gateway GPRS support node and, once established, can typically carry multiple flows. Each flow normally represents, for example, a particular service and/or a media component of a particular service. The PDP context therefore often represents a logical communication pathway for one or more flows across the network. To implement the PDP context between user equipment and the serving GPRS support node, at least one radio access bearer (RAB) needs to be established which commonly allows for data transfer for the user equipment. The implementation of these logical and physical channels is known to those skilled in the art and is therefore not discussed further herein.

FIG. 1 shows also a plurality of application servers 50 connected to the exemplifying Internet Protocol (IP) Multimedia network 45. The user equipment 30 may connect, via the GPRS network 32 and an IMS network 45, to at least one of the application servers 50. It shall be appreciated that a great number of application servers may be connected to a data network.

Communication with the application servers is controlled by means of functions of the data network that are provided by appropriate controller entities. For example, in the current third generation (3G) wireless multimedia network architectures it is assumed that several different servers providing various control functions are used for the control. These include functions such as the call session or call state control functions (CSCFs). The call session functions may be divided into various categories. FIG. 1 shows proxy call session control functions (P-CSCF) 35 and 37 and a serving call session control function (S-CSCF) 36. It shall be appreciated that similar functions may be referred to in different systems with different names.

A user who wishes to use services provided by an application server via the IMS system may need first to register with a serving controller, such as the serving call session control function (S-CSCF) 36. The registration is required to enable the user equipment to request a service from the multimedia system. As shown in FIG. 1, communication between the S-CSCF 36 and the user equipment 30 may be routed via at least one proxy call session control function (P-CSCF) 35. The proxy CSCF 35 thus acts as a proxy which forwards messages from the GGSN 34 to a serving call session control function 36 and vice versa.

The REGISTER message used by the user above is one example of a SIP (session initiation protocol) message. Other request SIP messages include, INVITE which indicates a user or service is being invited to participate in a call session, ACK which confirms that the client has received a final response to an INVITE request, BYE which terminates a call and can be sent by either the caller or the callee, CANCEL which cancels any pending searches but does not terminate a call that has already been accepted, and OPTIONS which queries the capabilities of servers.

As has been described earlier it is known to compress these SIP messages using the protocol set known as SigComp. This protocol set is defined in RFC (request for comments) 3320 "Signaling Compression (SigComp)". Furthermore in order to perform both compression and decompression within a device a UDVM (universal decompression virtual machine) is initiated for each message to be compressed or decompressed.

The UDVM initiated for a compression procedure is also known as a compressor. A UDVM initiated for a decompression procedure is also known as a decompressor. The UDVM on initiation is defined within a memory space specified by the SigComp protocols. The memory space used in a compression procedure is known as the compression memory, and similarly the memory space used in a decompression procedure is known as a decompression space.

The typical compression algorithms used by the UDVM for SigComp protocol messages and data streams are the various known LZ77 compression algorithm variants. The LZ77 compression algorithm works by storing a history window of the most recently read data and comparing the current data being encoded with the data in the history window. The output compressed stream/message contains references to the position in the history window, and the length of the match. If a match cannot be found within the history window the character itself is simply encoded into the stream and flagged as a 'literal'. The compressed stream/message therefore comprises two types of symbols, literals and length/position pairs. The most popular variants of the algorithm family are the LZW, LZSS and DEFLATE algorithms. The differences between these lies in the algorithm used to search current data from the history window, the LZSS algorithm uses a simple binary tree search whereas the DEFLATE algorithm uses a hash table search. For the examples detailed below the DEFLATE algorithm and a bytecode implementation of the DEFLATE algorithm are described. However the principles of the invention as described hereafter can be applied to any implementation of the DEFLATE algorithm and/or other SigComp bytecode.

A typical bytecode interpretation of a DEFLATE algorithm is shown below.

```
:next_character
INPUT-HUFFMAN (index, end_of_message, 4,
    7, 0, 23, length_table_start,
    1, 48, 191, 0,
    0, 192, 199, length_table_mid,
    1, 400, 511, 144)
COMPARE ($index, length_table_start, literal, end_of_message, length_distance)
:literal
set (index_lsb, (index + 1))
OUTPUT (index_lsb, 1)
COPY-LITERAL (index_lsb, 1, $decompressed_pointer)
JUMP (next_character)
:length_distance
MULTIPLY ($index, 4)
COPY ($index, 4, extra_length_bits)
INPUT-BITS ($extra_length_bits, extra_length_bits, !)
ADD ($length_value, $extra_length_bits)
INPUT-HUFFMAN (index, !, 1, 5, 0, 31, distance_table_start)
MULTIPLY ($index, 4)
COPY ($index, 4, extra_distance_bits)
INPUT-BITS ($extra_distance_bits, extra_distance_bits, !)
ADD ($distance_value, $extra_distance_bits)
LOAD (index, $decompressed_pointer)
COPY-OFFSET ($distance_value, $length_value, $decompressed_pointer)
OUTPUT ($index, $length_value)
JUMP (next_character)
:end_of_message
```

Figure 2:
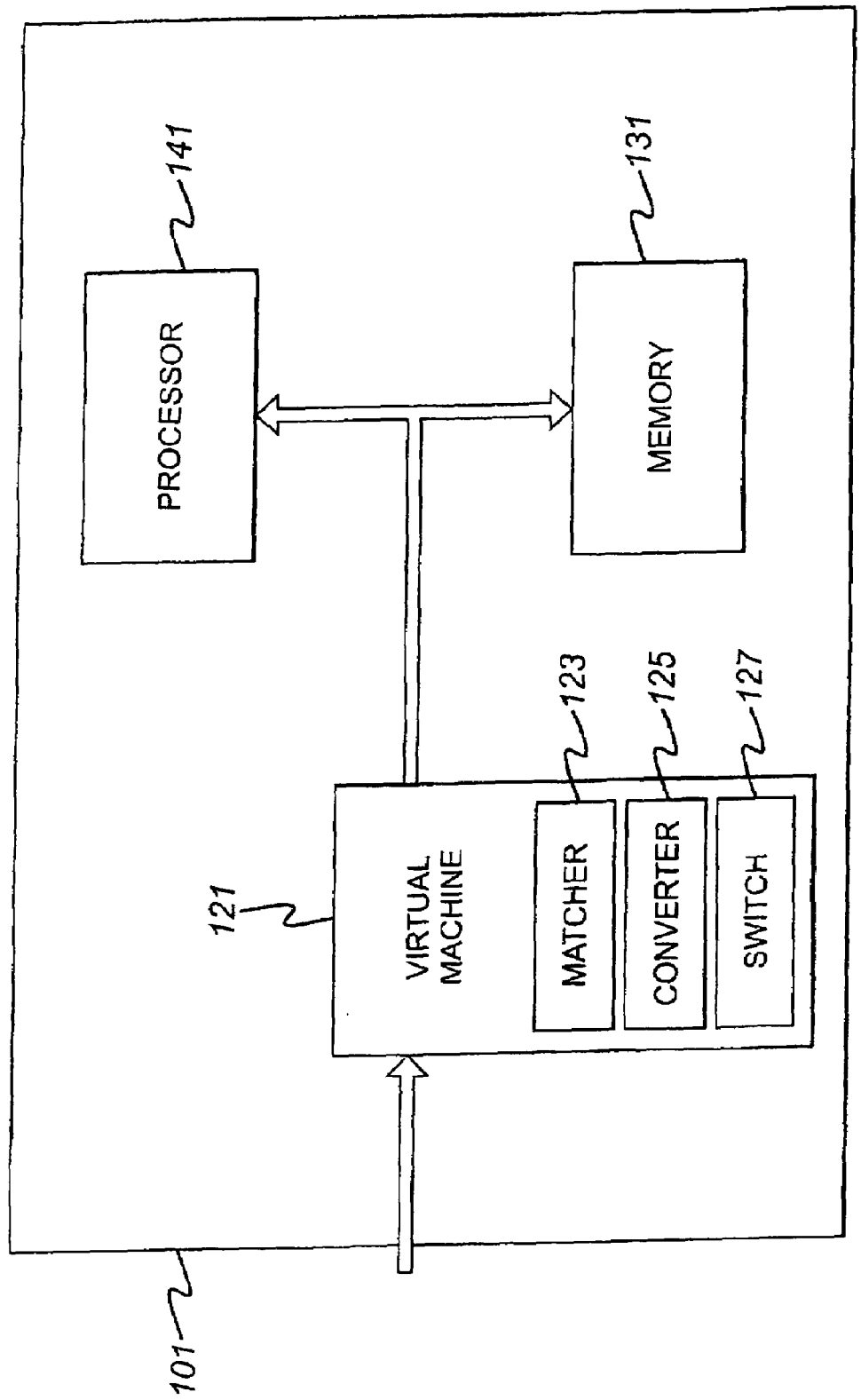
FIG. 2 shows a schematic view of a device within a communications system in accordance with an embodiment of the present invention.

With reference to FIG. 2 a simplified device capable of operating embodiments of the invention is shown. The device 101 comprises a native code processor 141, a memory 131 and a virtual machine 121. The native code processor receives and processes device specific code. The virtual machine 121 receives virtual machine code, also known as bytecode, and outputs device specific code to the processor. The memory 131 connected to both the native code processor 141 and the virtual machine 121 stores data which can be used by both the native code processor 141 and the virtual machine 121.

In some embodiments of the present invention the virtual machine 121 is implemented in software running on the native code processor 141. In other embodiments of the present invention the virtual machine 121 is implemented in software running on a co-processor (not shown) or implemented in hardware (not shown) separate from the native code processor 141.

The virtual machine 121 comprises a code converter 125 (or as also known a virtual machine interpreter). The code converter 125 receives the bytecode and converts it to the device specific code which it outputs to the processor 141.

The virtual machine 121 also comprises a code matcher 123 and a code switcher 127. At the same time as the code converter 125 receives the bytecode, the code matcher receives the same bytecode and attempts to detect within the bytecode known signature code blocks. These signature code blocks are described in further detail below. The signature code blocks are also known as 'basic' or 'hot' code blocks and once detected allow the virtual machine to identify the received bytecode block. This process is also described as producing a 'signature' of the received bytecode block from the detected signature bytecode.

The signature of the received bytecode block can then be used by the matcher to search against a list of known bytecode block signatures for which there is a reference to an optimized native code part is stored in the device 101.

The code switcher 127 receives the output of the code matcher 123, and where the code matcher 123 detects a signature match against the received bytecode block signature, passes the referenced optimized code to the processor 141 so that the processor processes the optimized code instead of the converted code from the converter 125.

In order to demonstrate the optimization that can be produced in such a system a simplified example of the system in operation will be described.

Figure 3:
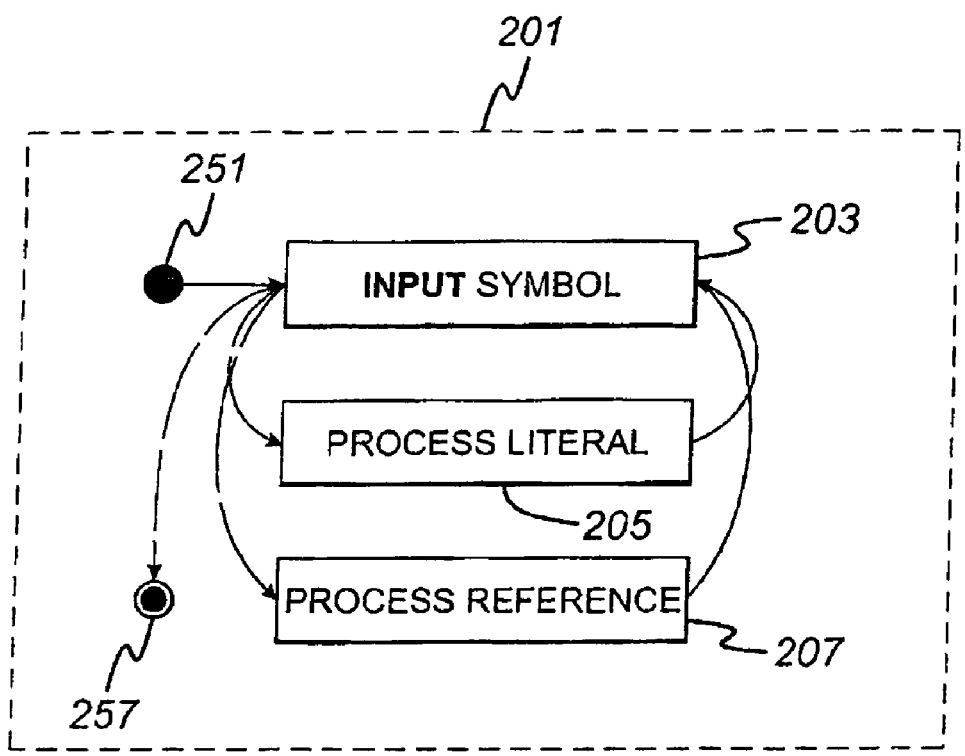
FIG. 3 shows a schematic view of a typical DEFLATE bytecode as represented by three basic code blocks.

Firstly with reference to FIG. 3 the signature code blocks within a DEFLATE algorithm are shown.

The DEFLATE algorithm 201 comprises a start point 251, an end point 257 and three signature blocks, the INPUT symbol block 203, the Process literal block 205 and the Process reference block 207. From the start point 251 the algorithm passes to the INPUT symbol block 203.

The INPUT symbol block 203 reads a part of the message to be compressed and detects if a copy is stored somewhere within the ring buffer. If it detects a copy it passes to the Process reference block 207, if it does not detect a copy it passes to the Process literal block 205. If it detects an end of message value it passes to the end point 257.

The INPUT symbol block 203 is represented in the assembly language code version shown above by the following part.

```
INPUT-HUFFMAN (index, end_of_message, 4,
    7, 0, 23, length_table_start,
    1, 48, 191, 0,
    0, 192, 199, length_table_mid,
    1, 400, 511, 144)
COMPARE ($index, length_table_start, literal, end_of_message,
    length_distance)
```

The process literal block 205 handles any literal values, i.e. unmatched symbols, by outputting them as part of the compressed data stream and also copying them to the ring buffer to be able to be checked against during the next detection.

The Process literal block 205 then passes back to the INPUT symbol block 203.

The Process literal block 205 is represented in the assembly language code version shown above by the following part.

```
OUTPUT (index_lsb, 1)
COPY-LITERAL (index_lsb, 1, $decompressed_pointer)
```

The Process reference block 207 handles any reference values, i.e. matched symbols, by outputting the reference—a position and a length pair as part of the compressed data stream and also copying the matched part to the ring buffer to be able to be checked against during the next detection.

The Process reference block 207 then passes back to the INPUT symbol block 203.

The Process reference block 205 is represented in the assembly language code version shown above by the following part.

```
MULTIPLY ($index, 4)
COPY ($index, 4, extra_length_bits)
INPUT-BITS ($extra_length_bits, extra_length_bits, !)
ADD ($length_value, $extra_length_bits)
INPUT-HUFFMAN (index, !, 1, 5, 0, 31, distance_table_start)
MULTIPLY ($index, 4)
COPY ($index, 4, extra_distance_bits)
INPUT-BITS ($extra_distance_bits, extra_distance_bits, !)
ADD ($distance_value, $extra_distance_bits)
LOAD (index, $decompressed_pointer)
COPY-OFFSET ($distance_value, $length_value,
    $decompressed_pointer)
OUTPUT ($index, $length_value)
```

As can be appreciated by the person skilled in the art these blocks can be arranged within the same algorithm in more than one way—for example the arrangement of which of the process blocks follows the INPUT symbol block provides at least two possibilities.

Thus any method employing a bytecode block recognition and replacement optimization as described with reference to the prior art has to recognize at least two variants.

Figure 4:
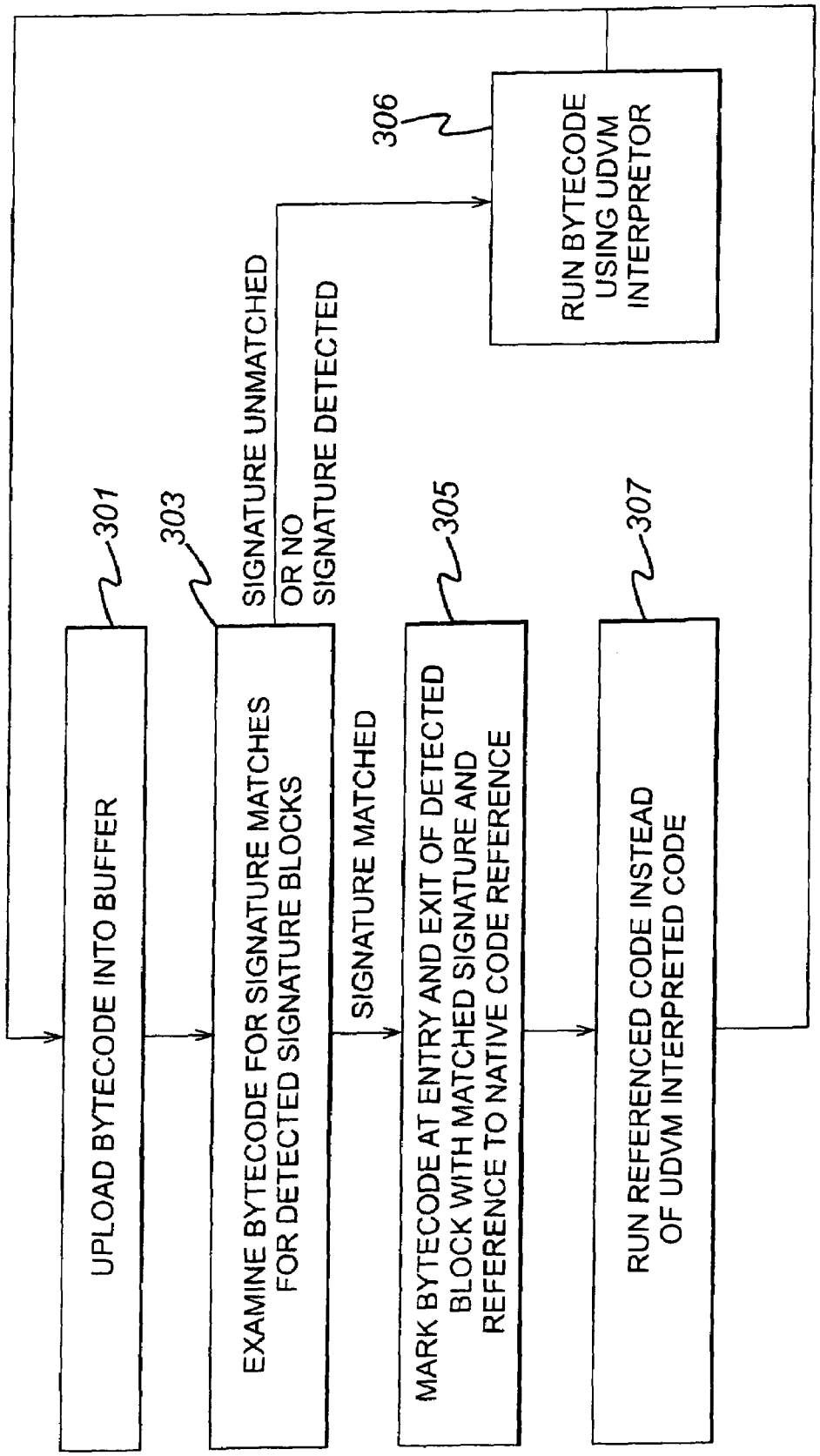
FIG. 4 shows a flow diagram for the operation of the UDVM during a compression operation in accordance with an embodiment of the present invention.

FIG. 4 shows a flow diagram showing the improved UDVM implementation embodiment within which the signature blocks as defined above can individually be recognized, the signature for the bytecode block searched and the bytecode block replaced.

In the first step 301 the bytecode is uploaded into a UDVM buffer, this may be in embodiments of the invention physically located within the memory 131.

In next step 303 the virtual machine detects any signature code blocks within the bytecode block and then attempts to match the detected signatures for a signature match against any of the known signatures stored previously.

A signature detection can be carried out in an embodiment of the present invention within the matcher 123 by examining the code in each code part and recognizing combinations of code. For example the detection of a signature for a Process literal block can be triggered if the code part contains the code lines below:

```
OUTPUT (index_lsb, 1)
COPY-LITERAL (index_lsb, 1, $decompressed_pointer)
```

In other embodiments of the invention the signature detection can be carried out by examining jump and branch code within the code parts to determine if it matches a known block. For example in this embodiment the memory references include references to index, distance_value, length_value, extra_distance_bits.

This process is carried out for the codebyte block so that there are one or more detected signature code blocks. Then using these detected signatures the matcher searches through a list of previously known signatures to try to find a match between the detected signature blocks and the stored list.

If no signature match on any of the known blocks is found the method passes to step 306. If a signature match is found then the method passes to step 305.

In step 306 the bytecode part passed to the UDVM interpreter/converter is converted into device code as if it was typically processed bytecode. The method on completion of this step, then loops back to step 303 to upload another section of received bytecode.

In step 305 the UDVM marks the start and finish of the matched bytecode block and reads a reference value associated to a native code interpretation of the bytecode block. The method then passes to the step 307.

In step 307 the UDVM switch 127 passes to the processor the optimized native code interpretation referenced by the matcher 123 on matching the bytecode block rather than the converted code from the converter 125. The optimized native code however maintains data integrity by reading from the same memory locations as instructed by the block and writing to the same memory locations as instructed by the block. Following the running of the native code the method passes to the step 303 wherein the next bytecode block is uploaded into the buffer.

In this manner the speed of performing the action of the basic block can be speeded up by a typical factor of between 50 to 100 times. Furthermore as these basic blocks within the bytecode are consistent within the bytecode—even if the positioning of these blocks within the bytecode then the signature matcher only is required to store a relatively small number of these signature block signatures in order to produce a significant improvement.

In further embodiments of the present invention the interpreter reads and searches the complete bytecode for the known signature blocks before running any code. In such an embodiment it is possible to further improve the speed of operation by performing a detected block analysis to determine if any further optimization is possible by the reordering of the signature blocks.

In further embodiments of the present invention any unmatched bytecode blocks can furthermore be flagged and stored in a further memory. These unrecognized bytecode blocks can then be examined at a later time by the operator of the network to determine if the block is suitable to be reclassified with either a known or its own native code interpretation for the specific device used.

The examples of the invention have been described in the context of an IMS system and GPRS networks. However, this invention is also applicable to any other standards. Furthermore, the given examples are described in the context of the so called all SIP networks with all SIP entities and communication channels known as PDP contexts. This invention is also applicable to any other appropriate communication systems, either wireless or fixed line systems, communication standards and communication protocols.

Examples of other possible communication systems enabling wireless data communication services, without limiting to these, include third generation mobile communication system such as the Universal Mobile Telecommunication System (UMTS), i-phone or CDMA2000 and the Terrestrial Trunked Radio (TETRA) system, the Enhanced Data rate for GSM Evolution (EDGE) mobile data network. Examples of fixed line systems include the diverse broadband techniques providing Internet access for users in different locations, such as at home and offices. Regardless the standards and protocols used for the communication network, the invention can be applied in all communication networks wherein registration in a network entity is required.

The embodiment of the invention has been discussed in the context of proxy and servicing call state control functions. Embodiments of the invention can be applicable to other network elements where applicable.

It is also noted herein that while the above describes exemplifying embodiments of the invention, there are several variations and modifications which may be made to the disclosed solution without departing from the scope of the invention as defined in the appended claims.

The invention claimed is:

1. A method executable on at least one processor, the method comprising:
  receiving a virtual machine bytecode block for carrying out decompression on a signalling message;
  detecting, in at least one part of the virtual machine bytecode block, at least one predefined code block;
  matching the virtual machine bytecode block comprising at least one detected predefined code block against a bytecode reference block comprising a reference to at least one instruction set;
  selecting the at least one instruction set based on the matching step;
  performing the selected at least one instruction set;
  detecting in a further part of the virtual machine bytecode block a further predefined code block;
  detecting, by a code order detector, an order of performing a first and further bytecode parts; and
  further selecting, by a code order optimizer, the at least one instruction set based on an output of the code order detector representing the order of performing the first and further bytecode parts.

2. The method as claimed in claim 1, wherein the step of detecting comprises the steps of:
  detecting the at least one part of the virtual machine bytecode block for references to memory locations used to at least one of read and write data; and
  matching the memory location references to predefined code block memory locations.

3. The method as claimed in claim 1, wherein the virtual machine bytecode is received by a universal decompression virtual machine.

4. The method as claimed in claim 1 wherein the at least one instruction set comprises native machine code.

5. The method as claimed in claim 1, wherein the step of detecting the order of performing the steps comprise the steps of:

comparing an order of performing combinations of the first and further bytecode parts, and assigning a performance metric to each combination, and wherein the step of further selecting the instruction set is based on a value of the performance metric.

6. An apparatus comprising:

a receiver configured to receive a virtual machine bytecode block;

a detector configured to detect in at least one part of the received virtual machine bytecode block at least one predefined code block, wherein the detector is configured to detect, within at least one further part of the virtual machine bytecode block, a further predefined code block;

a matcher configured receive an output of the detector and further configured to match the at least one part of the received virtual machine bytecode block comprising the at least one detected predefined code block with a bytecode reference comprising the at least one detected code block, the bytecode reference comprising a reference to an instruction set;

a selector configured to receive the bytecode reference and select the instruction set based on the received bytecode reference;

a processor configured to receive the instruction set and process the instruction set;

a code order detector configured to detect an order of performing a first and further bytecode parts; and a code order optimizer configured to select the instruction set based on the output of the code order detector.

7. The apparatus as claimed in claim 6, wherein the detector further comprises a memory detector configured to examine the at least one part of the virtual machine bytecode block for references to memory locations used to read and write data, and to detect whether the memory location references are the same as a predefined code block memory locations.

8. The apparatus as claimed in claim 6, wherein the receiver comprises a universal decompression virtual machine bytecode receiver.

9. The apparatus as claimed in claim 6, wherein the instruction set comprises native machine code.

10. The apparatus as claimed in claim 6, wherein the apparatus is configured as user equipment.

11. The apparatus as claimed in claim 6, wherein the bytecode block comprises at least part of a compressed Session Initiation Protocol (SIP) message.

12. A computer-readable storage medium including a computer program, the computer program configured to control a process to perform a process comprising:

receiving a virtual machine bytecode block for carrying out decompression on a signalling message;

detecting in at least one part of the virtual machine bytecode block at least one predefined code block, matching the virtual machine bytecode block comprising at least one detected predefined code blocks against a bytecode reference block comprising a reference to at least one instruction set;

selecting the at least one instruction set based on the matching step;

performing the selected at least one instruction set;

detecting in a further part of the virtual machine bytecode block a further predefined code block;

detecting, by a code order detector, an order of performing a first and further bytecode parts; and further selecting, by a code order optimizer, the at least one instruction set based on an output of the code order detector representing the order of performing the first and further bytecode parts.

13. An apparatus comprising:

reception means for receiving a virtual machine bytecode block;

detection means for detecting in at least one part of the received virtual machine bytecode block at least one predefined code block, wherein the detection means is configured to detect, within at least one further part of the virtual machine bytecode block, a further predefined code block;

match means for receiving an output of the detection means and matching the at least one part of the received virtual machine bytecode block comprising the at least one detected code block with a bytecode reference comprising the at least one detected code block, the bytecode reference comprising a reference to an instruction set;

selection means for receiving the bytecode reference and selecting the instruction set based on the received bytecode reference; and process means for receiving the instruction set and processing the instruction set;

a code order detection means for detecting an order of performing the first and further bytecode parts; and a code order optimizing means for selecting the instruction set based on the output of a code order detector.

* * * * *

UNITED STATES PATENT AND TRADEMARK OFFICE
CERTIFICATE OF CORRECTION

PATENT NO. : 7,657,656 B2  Page 1 of 1
APPLICATION NO. : 11/505327
DATED : February 2, 2010
INVENTOR(S) : Pekka Pessi It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 690 days.

Signed and Sealed this

Fourth Day of January, 2011

David J. Kappos
*Director of the United States Patent and Trademark Office*